US012648202B2

(12) United States Patent
Miyata et al.

(10) Patent No.: US 12,648,202 B2
(45) Date of Patent: Jun. 2, 2026

(54) SEMICONDUCTOR DEVICE, METHOD OF MANUFACTURING SEMICONDUCTOR DEVICE, AND POWER CONVERSION DEVICE

(71) Applicant: Mitsubishi Electric Corporation, Tokyo (JP)

(72) Inventors: Yusuke Miyata, Tokyo (JP); Kenji Suzuki, Tokyo (JP); Yuki Haraguchi, Tokyo (JP); Haruhiko Minamitake, Tokyo (JP); Taiki Hoshi, Tokyo (JP); Hidenori Koketsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 545 days.

(21) Appl. No.: 18/334,284

(22) Filed: Jun. 13, 2023

(65) Prior Publication Data

US 2024/0072124 A1    Feb. 29, 2024

(30) Foreign Application Priority Data

Aug. 23, 2022    (JP) ................................. 2022-132218

(51) Int. Cl.
*H10D 62/60*        (2025.01)
*H02M 7/5387*        (2007.01)
(Continued)

(52) U.S. Cl.
CPC ........ *H10D 62/60* (2025.01); *H02M 7/53875* (2013.01); *H10D 12/038* (2025.01); *H10D 12/481* (2025.01); *H10D 62/127* (2025.01)

(58) Field of Classification Search
CPC .... H10D 62/60; H10D 62/127; H10D 12/481; H10D 12/038; H02M 7/53875
(Continued)

(56) References Cited

U.S. PATENT DOCUMENTS

2014/0246750 A1*   9/2014  Takishita ............... H10D 62/60
                                                           257/493
2014/0357026 A1*  12/2014  Kobayashi ............ H01L 21/263
                                                           438/530
(Continued)

FOREIGN PATENT DOCUMENTS

JP        2016-009868 A    1/2016
WO        2013/089256 A1    6/2013
WO        2021/125064 A1    6/2021

*Primary Examiner* — Igwe U Anya
(74) *Attorney, Agent, or Firm* — Studebaker Brackett PLLC

(57)        ABSTRACT

Provided is a semiconductor device and a method of manufacturing a semiconductor device in which deterioration of energy loss is suppressed. The semiconductor device includes: a drift layer of a first conductivity type provided between a first main surface and a second main surface of a semiconductor substrate; and a field stop layer of the first conductivity type having an impurity concentration higher than that of the drift layer and provided between the drift layer and the second main surface. A net carrier concentration profile at room temperature of the field stop layer have at least one peak from the second main surface toward the first main surface. A hydrogen atom concentration profile of the field stop layer have at least two peaks from the second main surface toward the first main surface. The hydrogen atom concentration profile has more peaks than the net carrier concentration profile.

16 Claims, 20 Drawing Sheets

(51) Int. Cl.
*H10D 12/00* (2025.01)
*H10D 12/01* (2025.01)
*H10D 62/10* (2025.01)

(58) Field of Classification Search
USPC ......................................................... 257/655
See application file for complete search history.

(56) References Cited

U.S. PATENT DOCUMENTS

| | | | |
|---|---|---|---|
| 2015/0371858 A1 | 12/2015 | Laven et al. | |
| 2016/0372541 A1* | 12/2016 | Onozawa | H10D 12/481 |
| 2020/0135847 A1* | 4/2020 | Kiyoi | H01L 21/26506 |
| 2022/0013635 A1* | 1/2022 | Tamura | H10D 62/60 |
| 2022/0084828 A1 | 3/2022 | Yoshida et al. | |
| 2022/0277959 A1* | 9/2022 | Agata | H01L 21/221 |
| 2022/0320288 A1* | 10/2022 | Agata | H10D 62/142 |
| 2023/0038712 A1* | 2/2023 | Harada | H10D 84/617 |

* cited by examiner

F I G.  1
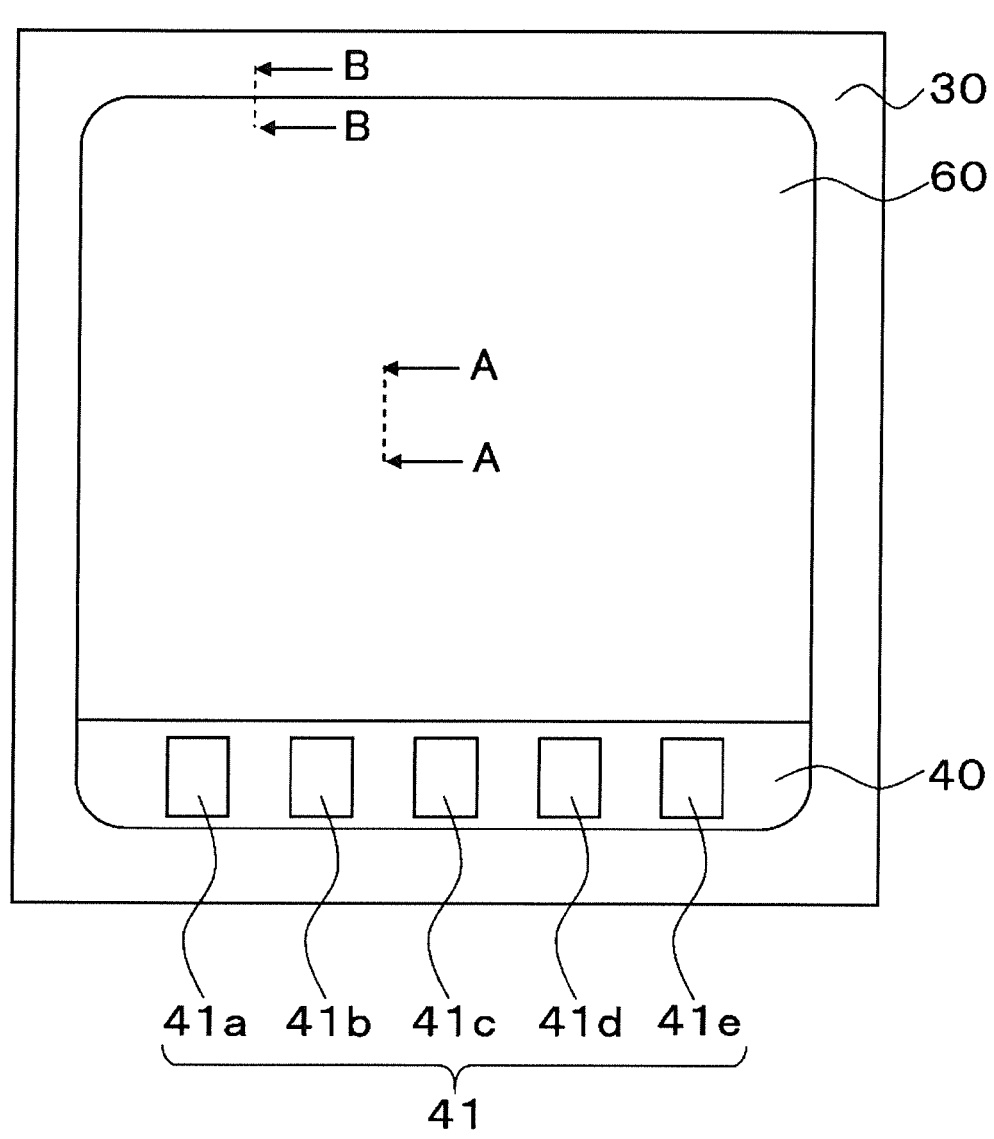

F I G.  2
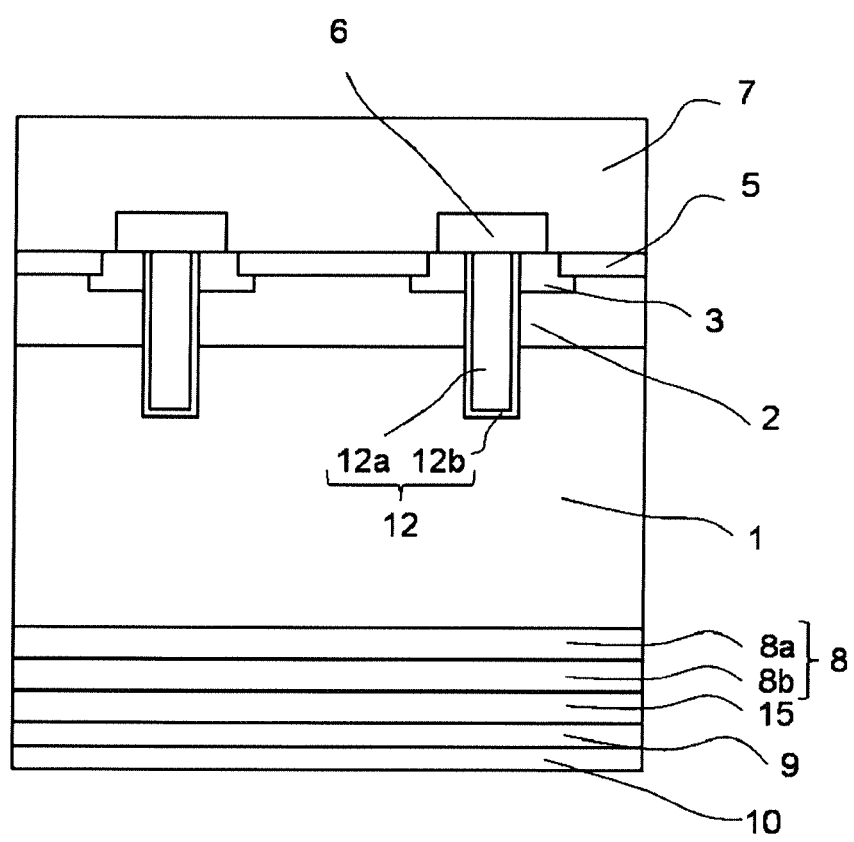

F I G.  3
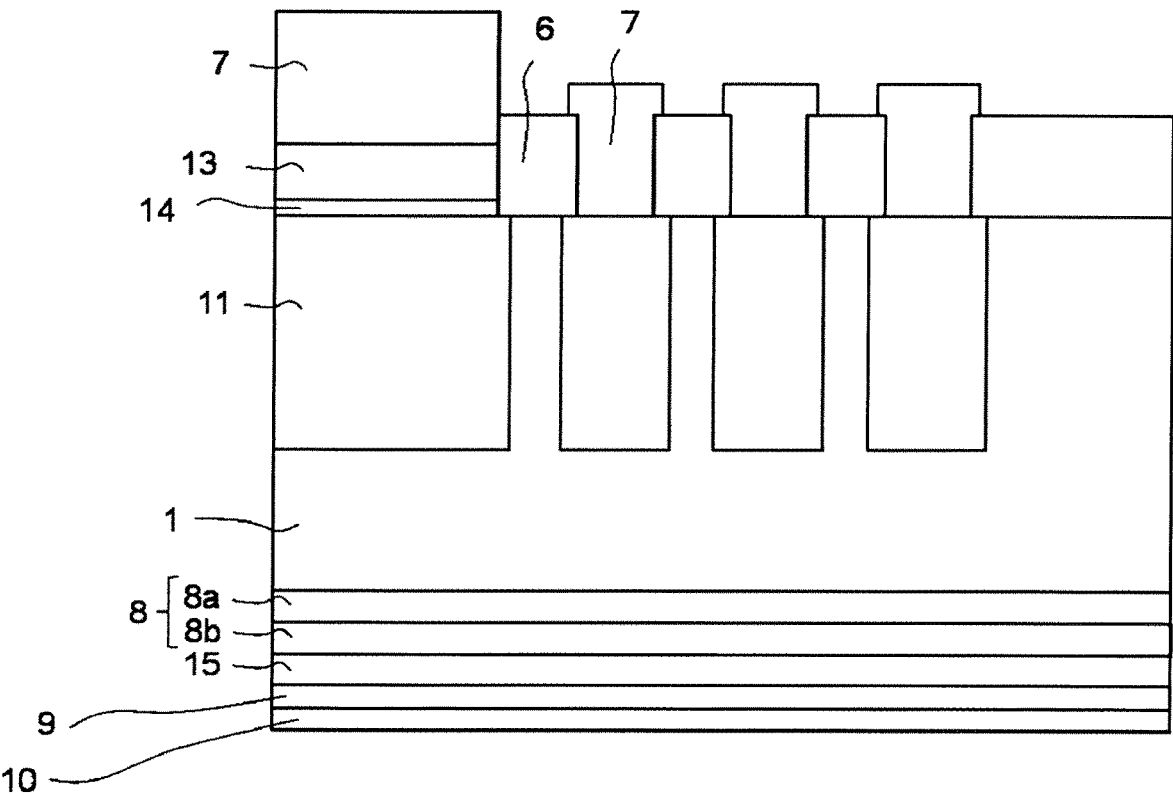

F I G.  4
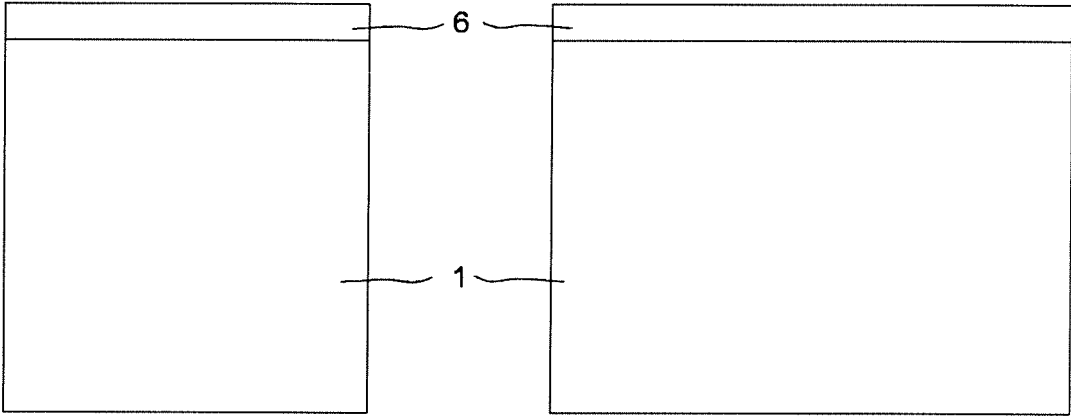

F I G.  5
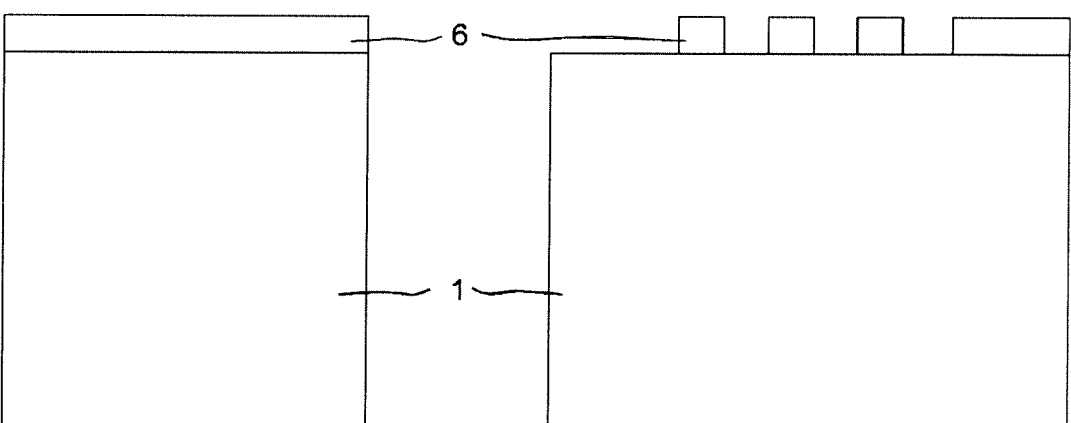

F I G. 6
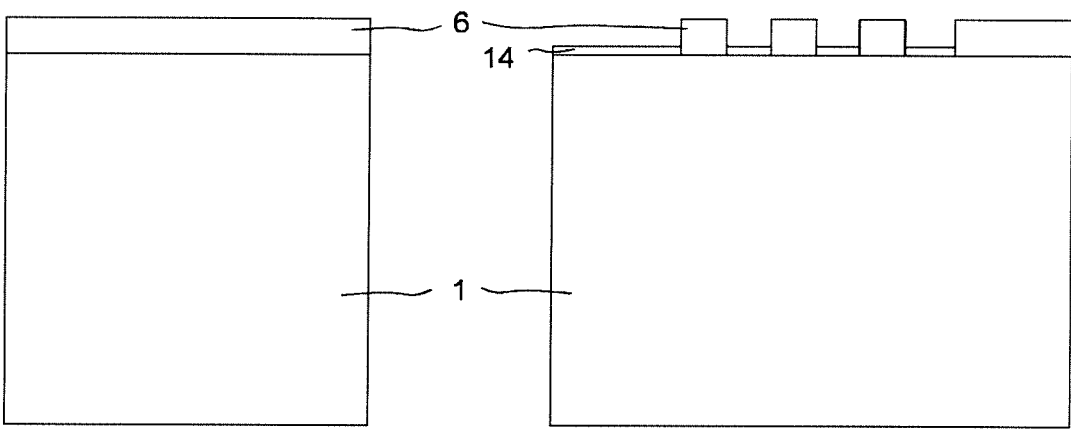

F I G. 7
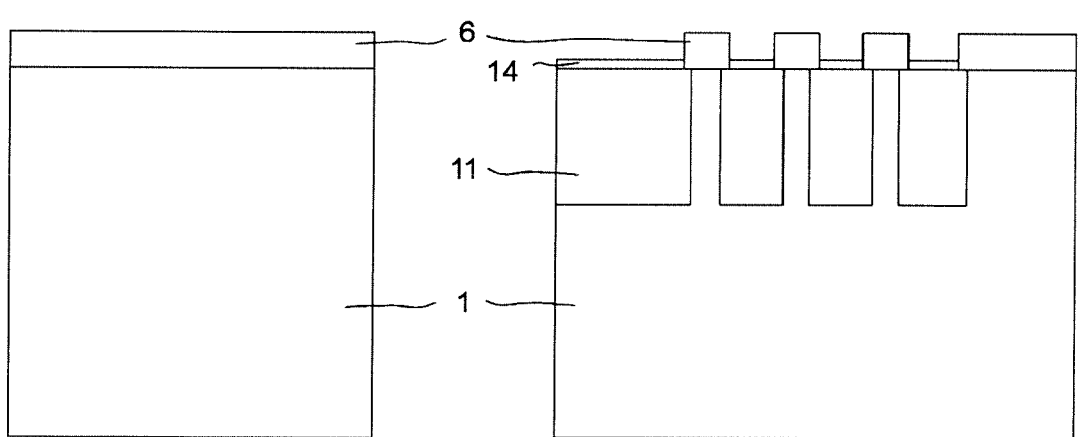

F I G.　8
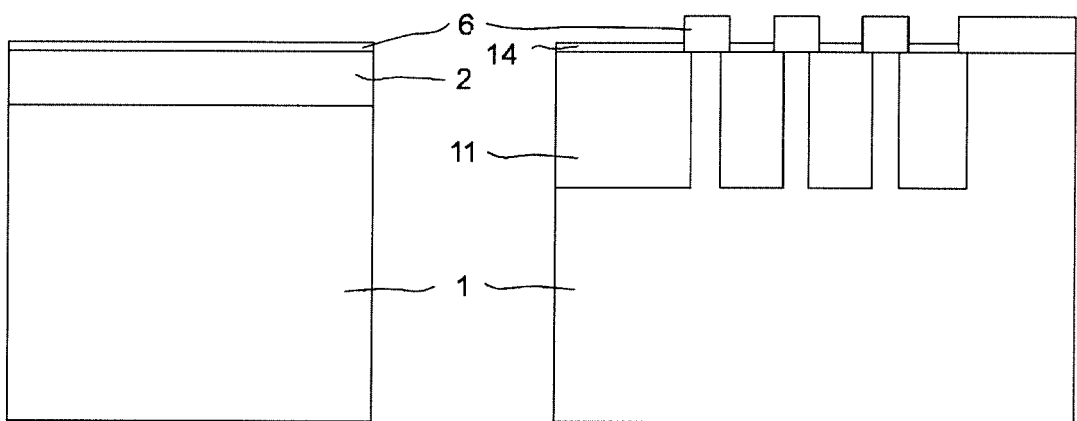

F I G.  9
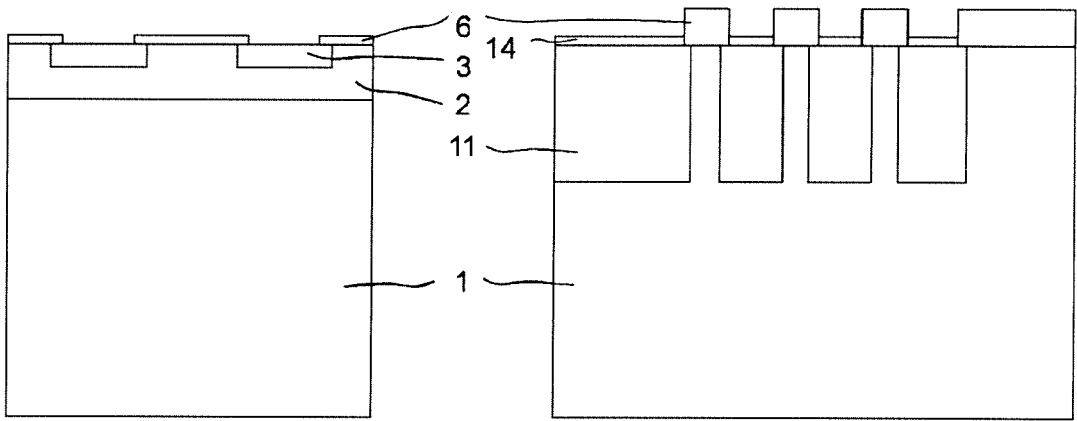

F I G .   1 0
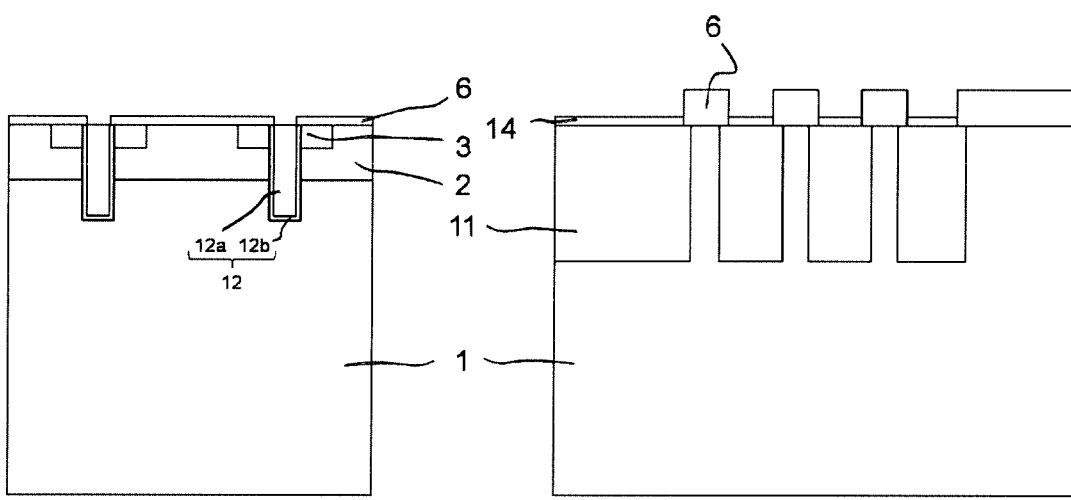

F I G.  1 1
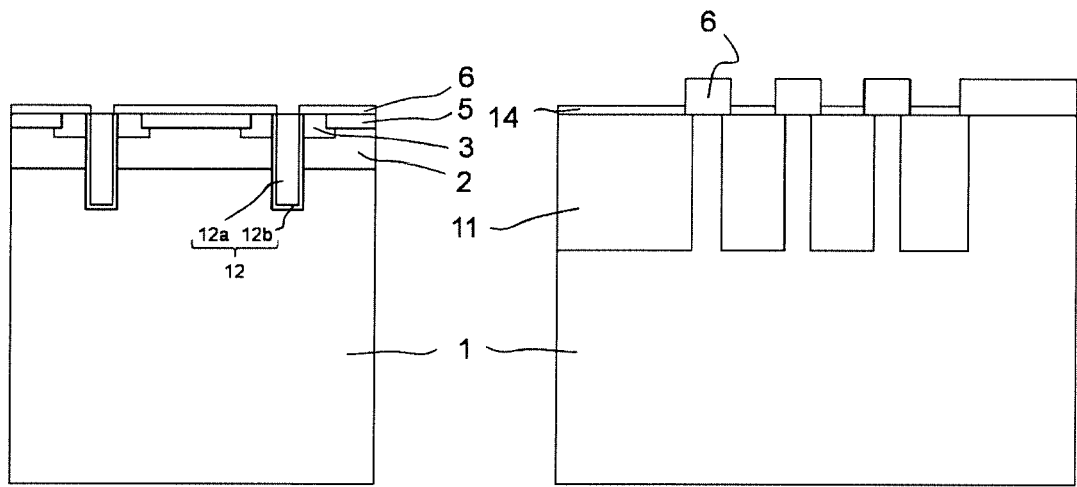

F I G.  1 2
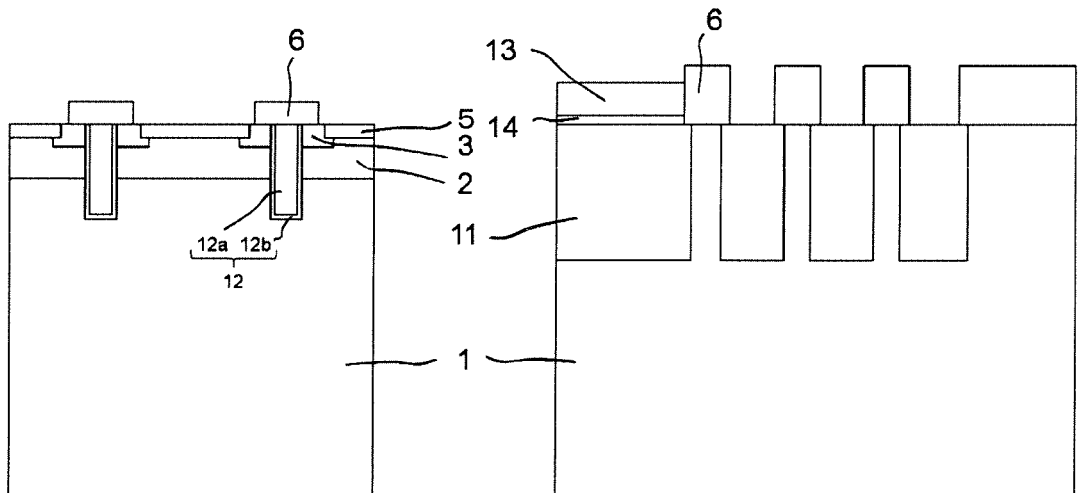

F I G.  1 3
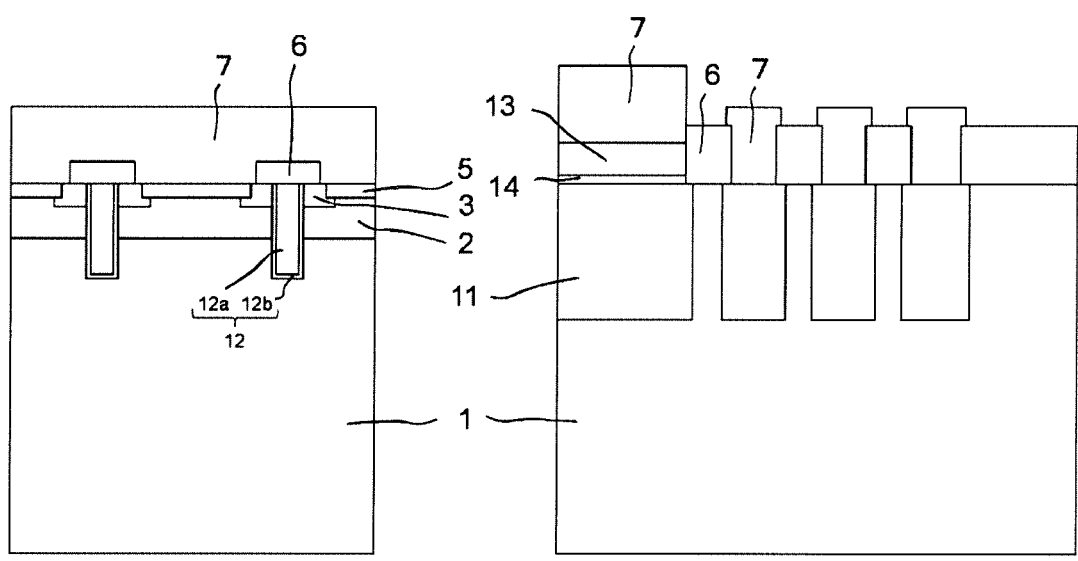

F I G .  1 4
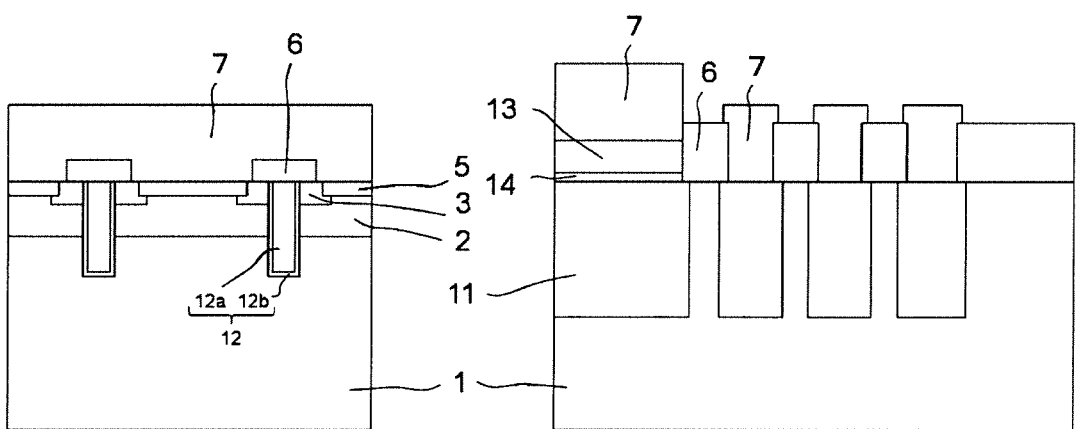

F I G.  1 5
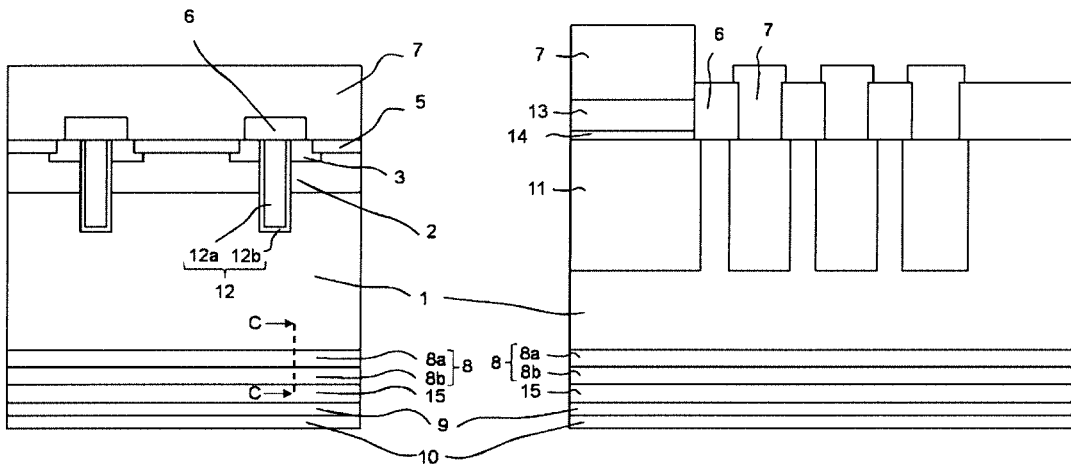

F I G.  1 6
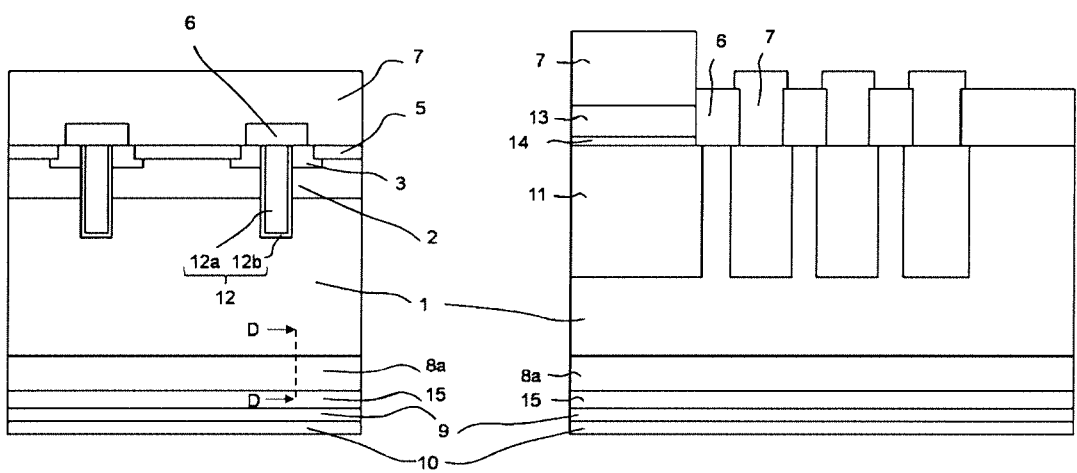

F I G.  1 7
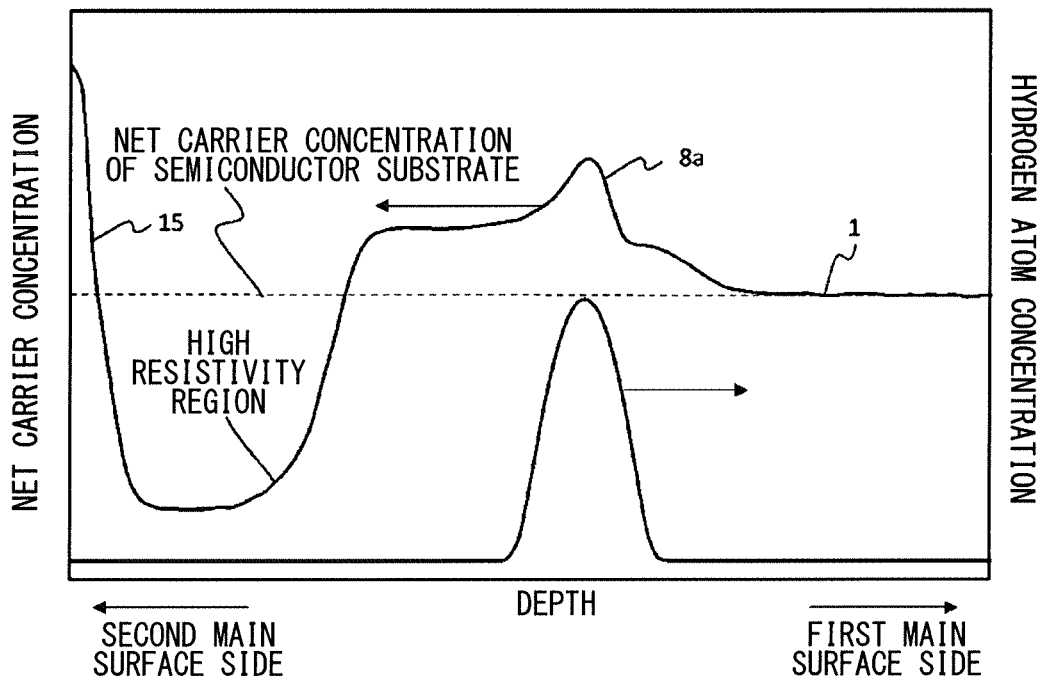

F I G.   1 8
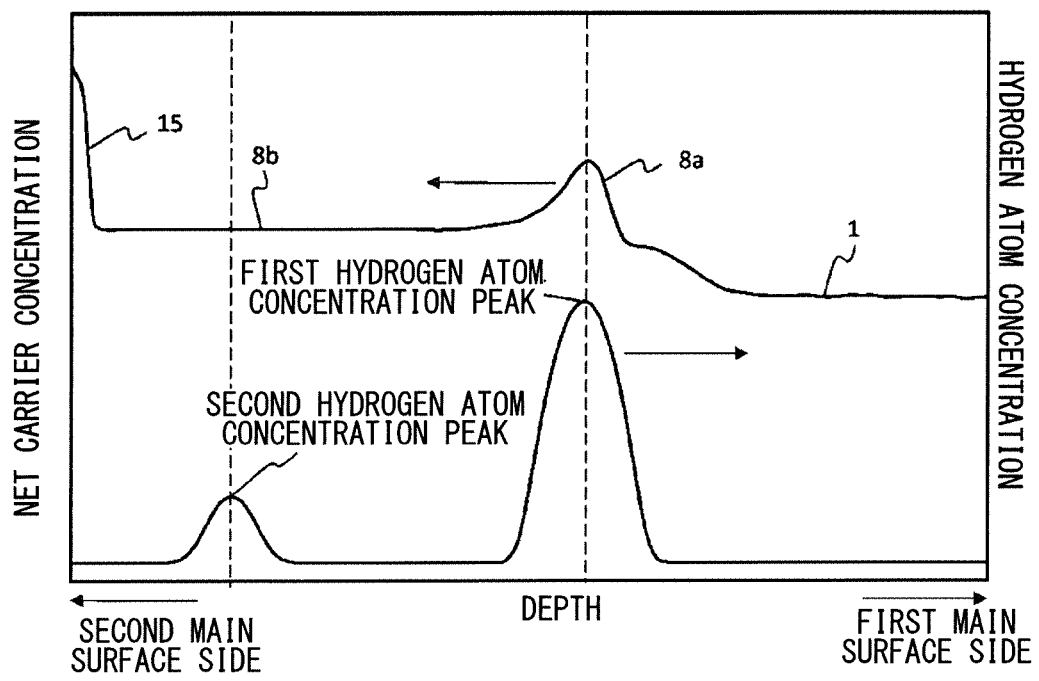

F I G.  1 9
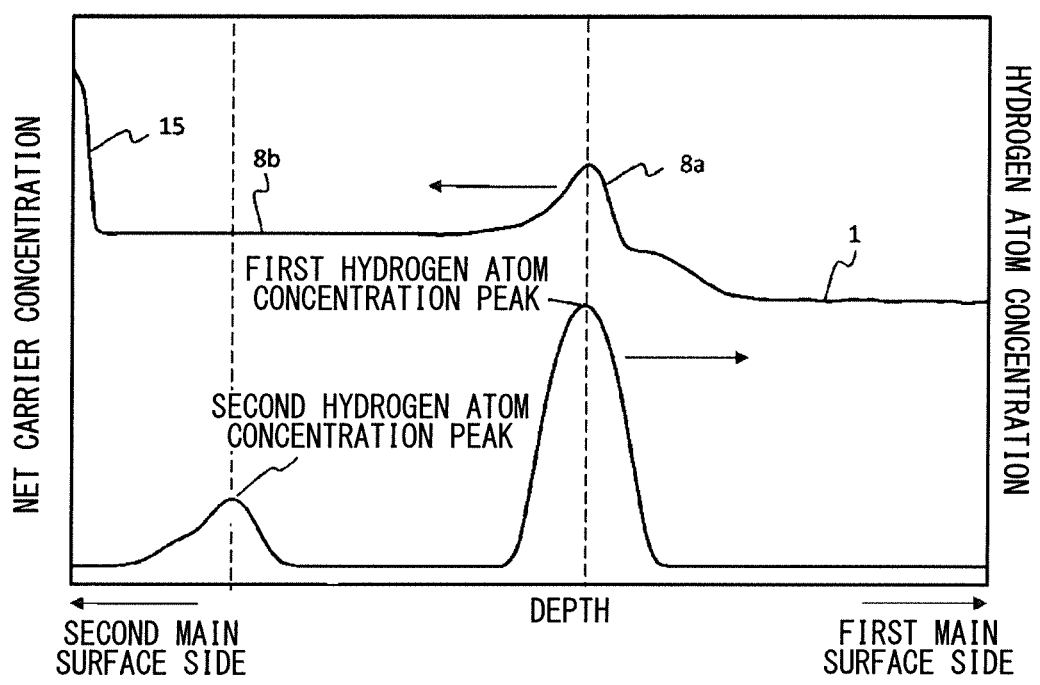

F I G .  2 0
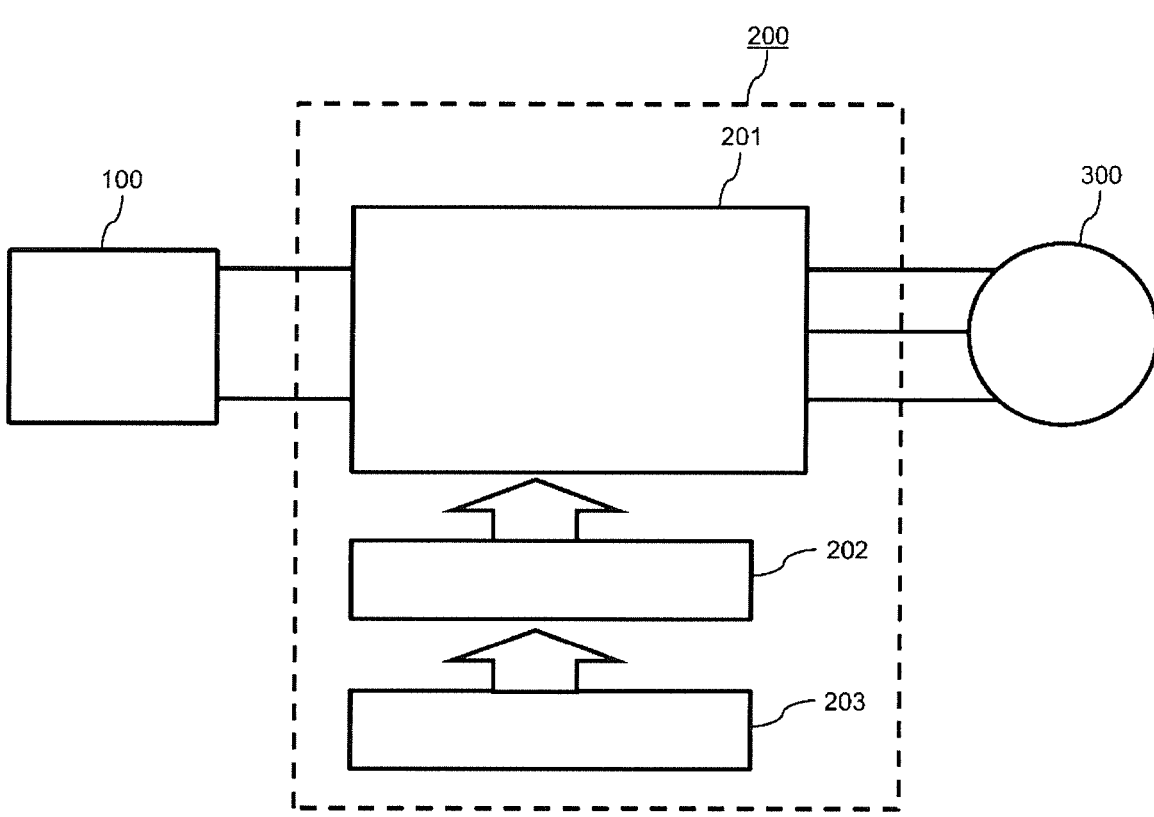

SEMICONDUCTOR DEVICE, METHOD OF MANUFACTURING SEMICONDUCTOR DEVICE, AND POWER CONVERSION DEVICE

BACKGROUND OF THE INVENTION

Field of the Invention

The present disclosure relates to a semiconductor device, a method of manufacturing a semiconductor device, and a power conversion device.

Description of the Background Art

In recent years, semiconductor devices with low energy loss are required in fields of electric railway, in-vehicle equipment, industrial machinery, or consumer equipment from a viewpoint of energy-saving. For example, reducing a thickness of a semiconductor wafer is effective in suppressing energy loss of a semiconductor device, since the resistance is reduced as the thickness is reduced. However, when the semiconductor wafer is thinned, depletion layer easily reaches to the back surface of the semiconductor wafer, and breakdown voltage deteriorates and leak current increases. Therefore, in International Publication No. WO 2013/089256, a semiconductor device capable of gently stopping the depletion layer by forming a buffer layer with an impurity concentration higher than that of a drift layer in back surface side of a semiconductor wafer is proposed.

In the semiconductor device in International Publication No. WO 2013/089256, there is a problem of deterioration of energy loss when a wafer with high oxygen impurity content is used.

SUMMARY

Provide is a semiconductor device and a method of manufacturing a semiconductor device in which a field stop layer with the same structure is formed under the same process irrespective of oxygen impurity content of a wafer used, and deterioration of energy loss is suppressed.

A semiconductor device according to the present disclosure includes: a drift layer of a first conductivity type provided between a first main surface and a second main surface of a semiconductor substrate having the first main surface and the second main surface opposite to the first main surface; and a field stop layer of the first conductivity type having an impurity concentration higher than that of the drift layer and provided between the drift layer and the second main surface. A net carrier concentration profile at room temperature of the field stop layer have at least one peak from the second main surface toward the first main surface. A hydrogen atom concentration profile of the field stop layer have at least two peaks from the second main surface toward the first main surface. The hydrogen atom concentration profile has more peaks than the net carrier concentration profile.

A method of manufacturing a semiconductor device according to the present disclosure includes: preparing a semiconductor substrate having a drift layer of the first conductivity type between a first main surface and a second main surface opposite to the first main surface; implanting first conductivity type impurities into the semiconductor substrate in a depth direction from the second main surface toward the first main surface; and performing a heat treatment in which the first conductivity type impurities are diffused, and a field stop layer having an impurity concentration higher than that of the drift layer and provided between the drift layer and the second main surface is formed. A net carrier concentration profile at room temperature of the field stop layer formed in the heat treatment have at least one peak from the second main surface toward the first main surface. A hydrogen atom concentration profile of the field stop layer formed in the heat treatment have at least two peaks from the second main surface toward the first main surface. The hydrogen atom concentration profile has more peaks than the net carrier concentration profile.

In the semiconductor device according to the present disclosure, as the field stop layer in which hydrogen atom concentration profile has more peaks than net carrier concentration profile is provided, high resistivity region in the net carrier concentration is removed and deterioration of energy loss is suppressed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view showing a semiconductor device according to a first embodiment.

FIG. 2 is a A-A cross-sectional view showing a configuration of a cell region of the semiconductor device according to the first embodiment.

FIG. 3 is a B-B cross-sectional view showing the configuration of the cell region of the semiconductor device according to the first embodiment.

FIG. 4 is a diagram showing a method of manufacturing the semiconductor device according to the first embodiment.

FIG. 5 is a diagram showing the method of manufacturing the semiconductor device according to the first embodiment.

FIG. 6 is a diagram showing the method of manufacturing the semiconductor device according to the first embodiment.

FIG. 7 is a diagram showing the method of manufacturing the semiconductor device according to the first embodiment.

FIG. 8 is a diagram showing the method of manufacturing the semiconductor device according to the first embodiment.

FIG. 9 is a diagram showing the method of manufacturing the semiconductor device according to the first embodiment.

FIG. 10 is a diagram showing the method of manufacturing the semiconductor device according to the first embodiment.

FIG. 11 is a diagram showing the method of manufacturing the semiconductor device according to the first embodiment.

FIG. 12 is a diagram showing the method of manufacturing the semiconductor device according to the first embodiment.

FIG. 13 is a diagram showing the method of manufacturing the semiconductor device according to the first embodiment.

FIG. 14 is a diagram showing the method of manufacturing the semiconductor device according to the first embodiment.

FIG. 15 is a diagram showing the method of manufacturing the semiconductor device according to the first embodiment.

FIG. 16 is a diagram showing a semiconductor device according to a comparative example.

FIG. 17 is a diagram showing distributions of net carrier concentration and hydrogen atom concentration of the semiconductor device according to the comparative example.

FIG. 18 is a diagram showing distributions of net carrier concentration and hydrogen atom concentration of the semiconductor device according to the first embodiment.

FIG. 19 is a diagram showing distributions of net carrier concentration and hydrogen atom concentration of the semiconductor device according to the first embodiment.

FIG. 20 is a block diagram showing a configuration of a power conversion system of a second embodiment.

DESCRIPTION OF THE PREFERRED EMBODIMENTS

Below, preferred embodiments are described with reference to figures. The figures are schematically shown, and relative sizes and positions can be changed. In the following description, similar or corresponding components are illustrated with the same reference numeral, and descriptions that are repetitive may be omitted.

Also, terms referring to specific positions and directions such as "upper", "lower", and "side" are used in some cases in the following description. These terms, however, shall be used for the sake of convenience and for the purpose of facilitating the understanding of the details of preferred embodiments, and shall not limit positions and directions when the preferred embodiments are practiced.

Also, in the following description, n and p types denote conductivity types of semiconductors. A first conductivity type will be taken as the n type and a second conductivity type will be taken as the p type in the present disclosure, but the first conductivity type may be taken as the p type and the second conductivity type may be taken as the n type. Also, an n– type indicates that the impurity concentration thereof is lower than that of the n type, and an n+ type indicates that the impurity concentration thereof is higher than that of the n type. Similarly, a p– type indicates that the impurity concentration thereof is lower than that of the p type, and a p+ type indicates that the impurity concentration thereof is higher than that of the p type.

First Embodiment

FIG. 1 is a plan view showing a semiconductor device 50 according to the first embodiment, which is an insulated gate bipolar transistor (IGBT). A cell region 60 may have a structure referred to as "stripe type" in which trench gates are arranged in stripe shape in plan view or may have a structure referred to as "island type" in which trench gates are arranged like islands in plan view.

As shown in FIG. 1, a pad region 40 is provided adjacent to the cell region 60. The pad region 40 is a region in which the control pads 41 for controlling the semiconductor device 50 are provided. Around a combined region of the cell region 60 and the pad region 40, a termination region 30 is provided for maintaining breakdown voltage of the semiconductor device 50. Note that the cell region 60 may be provided in the pad region 40.

The control pad 41 is, for example, a current sense pad 41*a*, a Kelvin-emitter pad 41*b*, a gate pad 41*c*, or temperature sense diode pads 41*d*, 41*e*. The current sense pad 41*a* is a control pad for sensing a current flowing in the cell region 60 of the semiconductor device 50. The current sense pad 41*a* is a control pad which is electrically connected to a part of the cell region 60 such that, when a current is flowing through the cell region 60 of the semiconductor device 50, one severalth to one several tens of thousandths of the total current flowing through the whole cell region flows through the current sense pad 41*a*.

The Kelvin-emitter pad 41*b* and the gate pad 41*c* are control pads to which a gate drive voltage for controlling on or off of the semiconductor device 50 is applied. The Kelvin-emitter pad 41*b* is electrically connected to a p type base layer of the cell region 60. The gate pad 41*c* is electrically connected to a gate trench electrode of an IGBT cell. The Kelvin-emitter pad 41*b* may be electrically connected to the p type base layer with interposition of a p+ type contact layer. The temperature sense diode pads 41*d*, 41*e* are control pads electrically connected to an anode and a cathode of a temperature sense diode provided in the semiconductor device 50. Temperature of the semiconductor device 50 is measured by measuring a voltage between the anode and the cathode of the temperature sense diode (not shown in figures) provided in the cell region.

FIG. 2 is a cross-sectional view of the semiconductor device 50 shown in FIG. 1 taken along the dashed line A-A. FIG. 3 is a cross-sectional view of the semiconductor device 50 shown in FIG. 1 taken along the dashed line B-B. Note that FIG. 15 shows the cross-sectional views shown in FIG. 2 and FIG. 3 on the left and right sides thereof, respectively.

In FIG. 2, the semiconductor device 50 includes an n– type drift layer 1 provided in a semiconductor substrate. In FIG. 2, the semiconductor substrate extends from n+ type emitter layers 3 and p+ type contact layers 5 to a p type collector layer 9. In FIG. 2, the upper edge of the n+ type emitter layers 3 and the p+ type contact layers 5 in the paper surface are referred to as a first main surface of the semiconductor substrate, and the lower edge of the p type collector layer 9 in the paper surface is referred to as a second main surface of the semiconductor substrate. The first main surface of the semiconductor substrate is a main surface in the front surface side of the semiconductor device 50. The second main surface of the semiconductor substrate is a main surface in the back surface side of the semiconductor device 50. The semiconductor device 50 includes the n– type drift layer 1 between the first main surface and the second main surface opposite to the first main surface. Although not shown in FIG. 2, in the semiconductor device 50, an n type carrier stored layer with an n type impurity concentration higher than that of the n– type drift layer 1 may be provided on the first main surface side of the n– type drift layer 1. By providing the n type carrier stored layer, conduction loss when a current flows through the semiconductor device 50 is suppressed. The n type carrier stored layer and the n– type drift layer may be collectively referred to as a drift layer. The n type carrier stored layer is formed by ion-implanting n type impurities into the semiconductor substrate that composes the n– type drift layer 1, and then diffusing the implanted n type impurities in the semiconductor substrate being the n– type drift layer 1 by annealing.

A p type base layer 2 is provided on the first main surface side of the n– type drift layer 1. The p type base layer 2 is in contact with gate trench insulation films 12*b* of trench gates 12. On the first main surface side of the p type base layer 2, the n+ type emitter layers 3 are provided in contact with the gate trench insulation films 12*b* of the trench gates 12, and the p+ type contact layers 5 are provided in the remaining region. The n+ type emitter layers 3 and the p+ type contact layers 5 composes the first main surface of the semiconductor substrate. The p+ type contact layers 5 are regions with a p type impurity concentration higher than that of the p type base layer 2. The p+ type contact layers 5 and the p type base layer 2 may be separately referred to when they need to be distinguished, and the p+ type contact layers 5 and the p type base layer 2 may be collectively referred to as a p type base layer.

In the semiconductor device 50, an n type field stop layer 8 with an n type impurity concentration higher than that of the n– type drift layer 1 is provided on the second main surface side of the n– type drift layer 1. The n type field stop layer 8 of the semiconductor device 50 includes a first n type field stop layer 8a and a second n type field stop layer 8b. The first n type field stop layer 8a and the second n type field stop layer 8b are formed through implantation of protons (H+).

FIG. 18 shows profiles of a net carrier concentration and a hydrogen atom concentration of the semiconductor device 50 of the first embodiment shown in FIG. 15 on the dashed line C-C, obtained through spreading resistance profiling (SRP), also referred to as spreading resistance analysis (SRA) and will be referred to as SR below, and secondary ion mass spectrometry (SIMS) respectively. In FIG. 18, a graph in the upper side of the figure shows the net carrier concentration, and a graph in the lower side of the figure shows the hydrogen atom concentration.

The net carrier concentration is a net free carrier concentration obtained through SR or capacitance measurement, for example. The net carrier concentration is definitely distinguished from impurity concentrations of hydrogen atoms, carbon atoms, phosphorus atoms, boron atoms, and the like obtained as atom concentrations through, for example, SIMS or time of flight SIMS (ToF SIMS). In general, foreign atoms which exist in a semiconductor substrate are called as impurities. The foreign atoms take specific atomic positions, and they release free electrons or free holes with energy that depends on surrounding environment such as atomic position, temperature, electric field, or fermi energy. Here, a ratio of free carrier concentration to impurity concentration is referred to as activation rate. Activation rate of phosphorus or boron that are representative impurities in silicon substrate is, for example, several ten percent at room temperature. On the other hand, activation rate of hydrogen is 0.1% to 10% at room temperature, and there is more than an order of magnitude difference between hydrogen atom concentration and hydrogen donor concentration, and they need to be definitely distinguished in argument.

In FIG. 18, as an example, a graph is shown in which the net carrier concentration of the semiconductor substrate is $5 \times 10^{13}$ cm$^{-3}$, the net carrier concentration at a position of first hydrogen atom concentration peak is $1 \times 10^{15}$ cm$^{-3}$, depth of the position of the first hydrogen atom concentration peak is 22 μm. Here, a peak of hydrogen atom concentration that coincide in depth with the peak of the net carrier concentration is referred to as the first hydrogen atom concentration peak, and a peak of hydrogen atom concentration with low dose that does not appear as a peak of the net carrier concentration is referred to as a second hydrogen atom concentration peak. The first hydrogen atom concentration peak and the second hydrogen atom concentration peak are shown by dashed line in FIG. 18.

Regarding the first hydrogen atom concentration peak, implantation dose amount is equal to or more than $1 \times 10^{13}$ cm$^{-2}$ and less than $1 \times 10^{15}$ cm$^{-2}$, implantation energy is equal to or more than 800 keV and less than 2000 keV. The first hydrogen atom concentration peak is formed in a region between equal to or more than 10 μm and equal to or less than 30 μm in depth. Regarding the second hydrogen atom concentration peak, implantation dose amount is equal to or more than $1 \times 10^{11}$ cm$^{-2}$ and less than $5 \times 10^{12}$ cm$^{-2}$, implantation energy is equal to or more than 200 keV and equal to or less than 800 keV. The second hydrogen atom concentration peak is formed in a region between equal to or more than 1 μm and less than 10 μm in depth. When the net carrier concentration in the region between equal to or more than 1 μm and less than 10 μm in depth is equal to or more than $1 \times 10^{14}$ cm$^{-3}$ and less than $1 \times 10^{15}$ cm$^{-3}$, a field stop layer can be formed such that the hydrogen atom concentration at the second hydrogen atom concentration peak can be measured by using analyzing methods such as SIMS whereas the net carrier concentration measured by, for example, SR does not have a peak at a position that coincide in depth with the second hydrogen atom concentration peak. Accordingly, by low dose implantation of hydrogen atoms that does not deform the net carrier concentration profile, the same field stop layers can be formed in semiconductor substrates with arbitrary oxygen or carbon impurity concentrations without changing the structure or function of the field stop layer.

By performing ion implantation such that the net carrier concentration profile does not have a peak in the same position as the second hydrogen atom concentration peak, ion implantation time can be reduced. For example, since ion implantation amount is proportional to ion implantation time, when ion implantation amount is reduced to 1/100, ion implantation time can also be reduced to 1/100, and productivity is increased. Note that when the ion implantation amount is reduced to 1/100, the second hydrogen atom concentration peak is 1/100 or less of the first hydrogen atom concentration peak.

Distribution of hydrogen atoms implanted with low dose before an activation annealing being a heat treatment is assumed to: have a tail from the second main surface side of the semiconductor substrate to the first main surface side; be symmetric with respect to the hydrogen atom concentration peak; and be approximated by, for example, a Gaussian function. The distribution having a tail described above may not be a normal distribution and may be a concentration distribution approximated by a Lorentzian function or by a Voigt function that is a convolution of a Gaussian function and a Lorentzian function.

After an activation annealing, whereas the distribution shown in FIG. 18 is symmetric with respect to the second hydrogen atom concentration peak, it is conceivable that the distribution is asymmetric with respect to the second hydrogen atom concentration peak and is a non-Gaussian distribution approximated by a non-Gaussian function or the like as shown in FIG. 19, for example. Shown in FIG. 19 are profiles, of the semiconductor device 50 of the first embodiment shown in FIG. 15 after a different heat treatment and taken along the dashed line C-C, showing the net carrier concentration and the hydrogen atom concentration obtained by SR and SIMS respectively. As a result of implantation of hydrogen atoms, defects are formed between the second main surface and the positions where hydrogen atoms have been implanted, whereas defects are hardly formed by the implantation from the positions where hydrogen atoms have been implanted toward the first main surface. Therefore, in some cases, hydrogen atom distribution may become asymmetric with respect to the hydrogen atom concentration peak in a process of repairing the defects between the second main surface and the positions where hydrogen atoms have been implanted in activation annealing.

Non-Gaussian distributions mean distributions that contain asymmetric component in the direction from the first main surface to the second main surface compared to Gaussian distributions. Distributions that contain asymmetric component may be concentration profiles that can be peak-decomposed by multiple Gaussian functions, Lorentzian functions, or Voigt functions.

Although a high dose hydrogen implantation for the first n type field stop layer 8a is performed at first and then a low dose hydrogen implantation for the second n type field stop layer 8b is performed, the order of the implantations may be reversed. For example, when the low dose hydrogen implantation is performed at an energy lower than that of the high dose hydrogen implantation and before the high dose hydrogen implantation, hydrogen atoms implanted in the low dose hydrogen implantation is knocked by hydrogen atoms implanted in the high dose implantation, and distribution of ions implanted in the low dose implantation can be made be approximated by a Gaussian distribution or a non-Gaussian distribution.

Formation of a high resistivity region described below can be suppressed even in a semiconductor substrate with high oxygen content and high carbon content, in which hydrogen atoms are difficult to diffuse, by diffusing hydrogen atoms implanted in the low dose implantation around wide implantation range of hydrogen atoms implanted in the high dose implantation by using knocking. Especially, although concentration peak tends to have smaller half width in the concentration distribution of ions implanted with low energy than in the concentration distribution of ions implanted with high energy, by performing the low dose hydrogen implantation described in the first embodiment before the high dose hydrogen implantation, the concentration peak of the low dose hydrogen implantation can have a half width larger than that of the high dose hydrogen implantation. Namely, the semiconductor device 50 can be manufactured such that the half width of the distribution having the second hydrogen atom concentration peak is larger than the half width of the distribution having the first hydrogen atom concentration peak, as shown in FIG. 18 or FIG. 19. By deliberately increasing the half width, hydrogen atoms are widely distributed in the high resistivity region formed in the range of the hydrogen implantation, and removal of the high resistivity region by activation anneal treatment become possible.

An n type buffer layer 15 is provided between the field stop layer 8 and the second main surface of the semiconductor substrate. The n type buffer layer 15 is formed by implanting phosphorus (P) or arsenic (As). The n type field stop layer 8 and the n type buffer layer 15 are provided in order to prevent punch through of the depletion layer that extend from the interface between the p type base layer 2 and the drift layer 1 toward the second main surface when the semiconductor device 50 is in off state.

In the semiconductor device 50, the p type collector layer 9 is formed on the lower side of the n type buffer layer 15, and the lower surface of the p type collector layer 9 composes the second main surface of the semiconductor substrate. The p type collector layer 9 is formed in the termination region 30 in addition to the cell region 60, and the p type collector layer 9 may be referred to as p type termination collector layer.

As shown in FIG. 2, in the semiconductor device 50, trenches are formed that penetrate the p type base layer 2 from the first main surface of the semiconductor substrate to reach the n− type drift layer 1. The trench gates 12 are formed by providing gate trench electrodes 12a in the trenches via the gate trench insulation films 12b. The gate trench electrodes 12a face the n− type drift layer 1, with the gate trench insulation films 12b therebetween. Note that dummy trench gates may be formed by providing dummy trench electrodes in the trenches via dummy trench insulation films, and both of the trench gates 12 and the dummy trench gates may be formed. The gate trench insulation films 12b of the trench gates 12 are in contact with the p type base layer 2 and the n+ type emitter layers 3. When a gate drive voltage is applied to the gate trench electrodes 12a, channels are formed in the p type base layer 2 that is in contact with the gate trench insulation films 12b of the trench gates 12.

As shown in FIG. 2, interlayer insulation films 6 are provided on the gate trench electrodes 12a of the trench gates 12. An emitter electrode 7 is formed on the interlayer insulation films 6. The emitter electrode 7 may be made of an aluminum alloy such as an aluminum-silicon alloy (Al—Si based alloy), for example. The emitter electrode 7 may be an electrode comprised of a plurality of metal films obtained by forming plating films by electroless plating or electroplating on an electrode made of an aluminum alloy. The plating films formed by electroless plating or electroplating may be nickel (Ni) or gold (Au) plating films, for example. A barrier metal may be formed on the regions of the first main surface of the semiconductor substrate where the interlayer insulation films 6 are not formed and on the interlayer insulation films 6. The barrier metal may be an electric conductor containing titanium (Ti), for example. Examples of the electric conductor may include titanium nitride (TiN) and titanium silicide (TiSi) obtained by alloying titanium and silicon (Si). Also, the barrier metal may be provided only on n type semiconductor layers such as the n+ type emitter layers 3. The barrier metal and the emitter electrode 7 may be collectively referred to as an emitter electrode.

When widths of contact holes provided in the interlayer insulation films 6 are narrow and the emitter electrode 7 cannot be embedded therein well, tungsten having better embeddability than the emitter electrode 7 may be placed in the contact holes and the emitter electrode 7 may be provided on tungsten.

A collector electrode 10 is provided on the second main surface side of the p type collector layer 9. Like the emitter electrode 7, the collector electrode 10 may be made of an aluminum alloy or made of an aluminum alloy and a plating film. The collector electrode 10 may be different in configuration from the emitter electrode 7. The collector electrode 10 is in ohmic contact with the p type collector layer 9 and is electrically connected to the p type collector layer 9.

FIG. 3 is a cross-sectional view showing a configuration of the termination region of the semiconductor device. FIG. 3 is the cross-sectional view taken along the dashed line B-B in FIG. 1 and is a cross-sectional view from the cell region 60 to the termination region 30.

As shown in FIG. 3, the termination region 30 of the semiconductor device 50 includes the n− type drift layer 1 between the first main surface and the second main surface of the semiconductor substrate. The first and second main surfaces in the termination region 30 are the same surface as the first and second main surfaces in the cell region 60, respectively. The n− type drift layer 1 in the termination region 30 is identical in configuration with the n− type drift layer 1 in the cell region 60 and is formed integrally with the n− type drift layer 1 in the cell region 60.

P type termination well layers 11 are provided on the first main surface side of the n− type drift layer 1, that is, between the first main surface of the semiconductor substrate and the n− type drift layer 1. The p type termination well layers 11 are semiconductor layers having, for example, boron or aluminum as p type impurities, and have a p type impurity concentration of $1\times10^{14}$ cm$^{-3}$ to $1\times10^{19}$ cm$^{-3}$. The p type termination well layers 11 are provided so as to surround the cell region 60. The p type termination well layers 11 are in the form of a plurality of rings. The number of the p type termination well layers 11 is selected, as appropriate, depending on the design of the breakdown voltage of the semiconductor device 50. An n+ type channel stopper layer may be provided in outer edge side than the p type termination well layers 11. The n+ type channel stopper layer may surround the p type termination well layers 11. The emitter electrodes 7 are provided on the p type termination well layers 11. The emitter electrodes 7 are in ohmic contact with the p type termination well layers 11 and are electrically connected to the p type termination well layers 11. The interlayer insulation films 6 are provided between the emitter electrodes 7 provided on the p type termination well layers 11, and the interlayer insulation films 6 insulates the emitter electrodes 7. Although the emitter electrode 7 is provided on the p type termination well layer 11 closest to the cell region side with interposition of an underlay oxide film 14 and a termination interlayer insulation film 13 therebetween, the underlay oxide film 14 and the termination interlayer insulation film 13 may not provided. A gate wiring electrically connected to the trench gates in the cell region, instead of the emitter electrode 7, may be provided on the p type termination well layer 11 closest to the cell region side.

The termination region 30 described above is an example, and a known breakdown voltage maintaining structure may be provided in the termination region 30 as appropriate. The breakdown voltage maintaining structure may be formed, for example, by providing a field limiting ring (FLR) including p type termination well layers made of a p type semiconductor and surrounding the cell region, or by providing a variation of lateral doping (VLD) including a p type well layer having a concentration gradient and surrounding the cell region, on a first main surface side that is a front surface side of the semiconductor device 50. The number of p type termination well layers having a ring-shaped configuration used for the FLR and the concentration distribution used for the VLD may be selected, as appropriate, depending on the design of the breakdown voltage of the semiconductor device 50. The p type termination well layers 11 may be provided over almost the entire pad region 40 shown in FIG. 1.

Next, a method of manufacturing the semiconductor device according to the first embodiment will be described. Note that description of a method of manufacturing the pad region 40 and the like formed in an arbitrary structure is omitted.

FIG. 4 to FIG. 15 show the method of manufacturing the semiconductor device according to the first embodiment and show the method of manufacturing the semiconductor device 50. FIG. 4 to FIG. 13 are figures showing processes of forming the structure on the front surface side of the semiconductor device 50. FIG. 14 and FIG. 15 are figures showing processes of forming the structure on the back surface side of the semiconductor device 50.

First, a semiconductor substrate constituting the n– type drift layer 1 is prepared, as shown in FIG. 4. A wafer known as an MCZ wafer produced by a magnetic field applied Czochralski (MCZ) method or a wafer known as an FZ wafer produced by an floating zone (FZ) method, for example, may be used for the semiconductor substrate. An n type wafer containing n type impurities may be used for the semiconductor substrate. The concentration of the n type impurities contained in the semiconductor substrate is selected, as appropriate, depending on the breakdown voltage of the semiconductor device to be produced. The oxygen impurity content of the MCZ wafer is equal to or more than $1\times10^{17}$ cm$^{-3}$ and is higher than the oxygen impurity content of the FZ wafer. The carbon impurity content of the MCZ wafer is equal to or more than $1\times10^{14}$ cm$^{-3}$ and equal to or less than $1\times10^{17}$ cm$^{-3}$ and is comparable to or lower than the carbon impurity content of the FZ wafer.

As shown in FIG. 4 and FIG. 5, although whole of the semiconductor substrate is the n– type drift layer 1 in the process of preparing the semiconductor substrate, a thick oxide film which is to be a mask is provided on the n– type drift layer 1 and the n– type drift layer 1 is selectively etched to form p type or n type semiconductor layers. As shown in FIG. 6 and FIG. 7, the p type termination well layers 11 are formed in the termination portion by forming the underlay oxide film 14 on the n– type drift layer 1, implanting p type impurities such as boron (B) from the first main surface side of the semiconductor substrate, and performing a heat treatment in nitrogen atmosphere in high temperature of 1000° C. or higher for at least 240 minutes. The heat treatment may be performed in oxygen atmosphere while oxidizing instead of the nitrogen atmosphere. In the heat treatment in high temperature, the temperature is around 500° C. when the boat on which the wafer is mounted is inserted to the annealing furnace and is then gradually increased to desired treatment temperature. By making the rate of temperature increase and decrease, for example, be equal to or less than 2° C./minute, slips, which are dislocation defects that occur in the wafer, can be prevented. Although boron (B) is selectively implanted by using the thick oxide film as a mask in the present embodiment, a resist may be applied on the n– type drift layer 1 and an opening may be formed in predetermined region of the resist by photolithography and ions may be implanted to a predetermined region of the semiconductor substrate through the opening. Below, a process of forming a mask on the semiconductor substrate, for the purpose of implanting ions to or performing etching in a predetermined region of the semiconductor substrate, is referred to as a mask process.

Next, as shown in FIG. 8, also in the n– type drift layer 1 in the cell region 60, the p type base layer 2 is formed by selectively implanting p type impurities, such as borons, after a mask process and performing a heat treatment to activate implanted impurities. The p type base layer 2 may have the same depth and p type impurity concentration as the p type termination well layers 11. In such a configuration, ions can be implanted at the same time, and thus the productivity of the semiconductor device is increased. In addition, since the p type base layer 2 have the same depth, electric field concentration is relieved, and deterioration of the breakdown voltage is suppressed. The p type base layer 2 may have different depth and p type impurity concentration, by separately implanting p type impurities to the p type base layer 2 by means of a mask processes.

Next, as shown in FIG. 9, the n+ type emitter layers 3 are formed by selectively implanting n type impurities to the first main surface side of the p type base layer 2 by means of a mask process and performing a heat treatment to activate implanted impurities. The n type impurities implanted are, for example, arsenic (As) or phosphorus (P).

Next, as shown in FIG. 10, the trench gates 12 that penetrate the p type base layer 2 from the first main surface of the semiconductor substrate to reach the n– type drift layer 1 are formed. Side wall of the trenches that penetrate the n+ type emitter layers 3 constitute part of the n+ type emitter layers 3. The trenches may be formed by depositing an oxide film of $SiO_2$ and the like on the semiconductor substrate, forming openings in part of the oxide film where the trenches are to be formed by means of a mask process, and etching the semiconductor substrate using the oxide film having the openings as a mask. Spacing between the trench gates 12 may be uniform or nonuniform. Pattern of the spacing between the trench gates 12 in plan view can be appropriately modified depending on a mask pattern of the mask process.

Next, the semiconductor substrate is heated in an oxygen-containing atmosphere, so that the gate trench insulation films 12b are formed on inner walls of the trenches and on the first main surface of the semiconductor substrate. Polysilicon doped with n type or p type impurities is deposited by a chemical vapor deposition (CVD) process and the like into the trenches with the gate trench insulation films 12b formed on the inner walls thereof and on the first main surface of the semiconductor substrate, to form the gate trench electrodes 12a. Although the ion implantation of the n+ type emitter layers 3 is performed before forming the trench gates 12 in the above description, the ion implantation of the n+ type emitter layers 3 may be performed after forming the trench gates 12. A gate wiring electrically connected to the gate trench electrodes 12a may be formed at the same time with the formation of the gate trench electrodes 12a, and the gate wiring may be formed on the underlay oxide film 14.

Next, as shown in FIG. 11, the p+ type contact layers 5 are formed by selectively implanting p type impurities to the first main surface side of the p type base layer 2 and the n+ type emitter layers 3 and performing a heat treatment to activate implanted impurities. The p type impurities implanted are, for example, Boron (B). A heat treatment for activation of the n+ type emitter layers 3 and the p+ type contact layers may be performed at the same time.

Next, as shown in FIG. 12, after forming the interlayer insulation films 6 and the termination interlayer insulation film 13 on the gate trench electrodes 12a, redundant oxide film formed on the first main surface of the semiconductor substrate is removed. The interlayer insulation films 6 and the termination interlayer insulation film 13 may be made of silicon dioxide ($SiO_2$), for example. Contact holes are formed in the interlayer insulation films 6 and the termination interlayer insulation film 13 by means of a mask process. The contact holes are formed on the n+ type emitter layers 3 and the p+ type contact layers 5. The interlayer insulation films 6, the termination interlayer insulation film 13, and the underlay oxide film 14 may be collectively referred to as interlayer insulation films. In each process, the underlay oxide film 14 may be removed during processes of removing redundant oxide film and may be formed again.

Next, as shown in FIG. 13, the emitter electrodes 7 are formed on the first main surface of the semiconductor substrate, the interlayer insulation films 6, and the termination interlayer insulation film 13 by depositing aluminum-silicon alloys (Al—Si based alloy) by a physical vapor deposition (PVD) process such as sputtering or evaporation. Nickel alloys or gold may be further formed on the aluminum-silicon alloys by electroless plating or electroplating to form the emitter electrodes. By forming the emitter electrodes by plating, since thick metal films can be easily formed as the emitter electrodes, heat capacity of the emitter electrodes can be increased and thus heat resistance can be increased. In the case where nickel alloys are further formed by a plating process after the formation of the emitter electrodes 7 made of the aluminum-silicon alloys by the PVD process, the plating process for the formation of the nickel alloys may be performed after the processing on the second main surface side of the semiconductor substrate. Barrier metals may be formed on the first main surface of the semiconductor substrate, the interlayer insulation films 6, and the termination interlayer insulation film 13 and the emitter electrodes 7 may be formed on the barrier metals. The barrier metals are formed by making titan or titanium nitride into films by a PDV or CVD process. A surface protection film may be selectively formed in the cell region 60 or the termination region 30 as necessary by using silicon nitride or organic material, such as polyimide or polybenzoxazole, with controlled conductivity or refractive index.

Next, as shown in FIG. 14, the second main surface side of the semiconductor substrate is ground, and the semiconductor substrate is thinned to a designed thickness. The thickness of the semiconductor substrate after the grinding may be 60 μm to 200 μm, for example.

Next, as shown in FIG. 15, the first n type field stop layer 8a and the second n type field stop layer 8b are formed by implanting n type impurities in two separate implantations from the second main surface side of the semiconductor substrate and by performing a heat treatment to activate implanted impurities. The first n type field stop layer 8a and the second n type field stop layer 8b are formed by implanting protons (H+), and the temperature of the heat treatment is equal to or more than 350° C. and equal to or less than 500° C. The implantation energy in forming the first n type field stop layer 8a may be higher than the implantation energy in forming the second n type field stop layer 8b.

In FIG. 18, as an example, a graph is shown in which the net carrier concentration of the semiconductor substrate is $5 \times 10^{13}$ $cm^{-3}$, the net carrier concentration at a position of the first hydrogen atom concentration peak is $1 \times 10^{15}$ $cm^{-3}$, depth of the position of the first hydrogen atom concentration peak is 22 μm. Here, a peak of hydrogen atom concentration that coincide in depth with the peak of the net carrier concentration is referred to as the first hydrogen atom concentration peak, and a peak of hydrogen atom concentration with low dose that does not appear as a peak of the net carrier concentration is referred to as a second hydrogen atom concentration peak. The first hydrogen atom concentration peak and the second hydrogen atom concentration peak are shown by dashed line in FIG. 18. Note that there may be a plurality of the first hydrogen atom concentration peaks, and there may be a plurality of the second hydrogen atom concentration peaks.

Regarding the first hydrogen atom concentration peak, implantation dose amount is equal to or more than $1 \times 10^{13}$ $cm^{-2}$ and less than $1 \times 10^{15}$ $cm^{-2}$, implantation energy is equal to or more than 800 keV and less than 2000 keV. The first hydrogen atom concentration peak is formed in a region between equal to or more than 10 μm and equal to or less than 30 μm in depth. Regarding the second hydrogen atom concentration peak, implantation dose amount is equal to or more than $1 \times 10^{11}$ $cm^{-2}$ and less than $5 \times 10^{12}$ $cm^{-2}$, implantation energy is equal to or more than 200 keV and equal to or less than 800 keV. The second hydrogen atom concentration peak is formed in a region between equal to or more than 1 μm and less than 10 μm in depth. When the net carrier concentration in the region between equal to or more than 1 μm and less than 10 μm in depth is equal to or more than $1 \times 10^{14}$ $cm^{-3}$ and less than $1 \times 10^{15}$ $cm^{-3}$, a field stop layer can be formed such that the hydrogen atom concentration at the second hydrogen atom concentration peak can be measured by using analyzing methods such as SIMS whereas the net carrier concentration measured by, for example, SR does not have a peak at a position that coincide in depth with the second hydrogen atom concentration peak. Accordingly, by low dose implantation of hydrogen atoms that does not deform the net carrier concentration profile, the same field stop layers can be formed in semiconductor substrates with arbitrary oxygen or carbon impurity concentrations without changing the structure or function of the field stop layer.

Although the high dose hydrogen implantation for the first n type field stop layer 8a is performed at first and then the low dose hydrogen implantation for the second n type field stop layer 8b is performed, the order of the implantations may be reversed. For example, when the low dose hydrogen implantation is performed at an energy lower than that of the high dose hydrogen implantation and before the high dose hydrogen implantation, hydrogen atoms implanted in the low dose hydrogen implantation are knocked by hydrogen atoms implanted in the high dose implantation, and distribution of ions implanted in the low dose implantation can be made be approximated by a Gaussian distribution or a non-Gaussian distribution.

Formation of a high resistivity region described below can be suppressed even in a semiconductor substrate with high oxygen content and high carbon content, in which hydrogen atoms are difficult to diffuse, by diffusing hydrogen atoms implanted in the low dose implantation around wide implantation range of hydrogen atoms implanted in the high dose implantation by using knocking. Especially, although concentration peak tends to have smaller half width in the concentration distribution of ions implanted with low energy than in the concentration distribution of ions implanted with high energy, by performing the low dose hydrogen implantation described in the first embodiment before the high dose hydrogen implantation, the concentration peak of the low dose hydrogen implantation can have a half width larger than that of the high dose hydrogen implantation. Namely, the half width of the distribution having the second hydrogen atom concentration peak is larger than the half width of the distribution having the first hydrogen atom concentration peak in FIG. 18 or FIG. 19. By deliberately increasing the half width, hydrogen atoms are widely distributed in the high resistivity region formed in the range of the hydrogen implantation, and removal of the high resistivity region by activation anneal treatment become possible.

Next, the n type buffer layer 15 is formed by implanting n type impurities from the second main surface side of the semiconductor substrate and performing a heat treatment to activate implanted impurities. The n type buffer layer 15 is formed by implanting phosphorus (P) ions. The acceleration energy in the implantation of phosphorus ions is equal to or less than 1000 keV, and the dose amount of phosphorus is equal to or more than $1 \times 10^{11}$ cm$^{-2}$ and equal to or less than $1 \times 10^{14}$ cm$^{-2}$. The n type buffer layer 15 may be formed by implanting arsenic (As) ions. Heat treatments for the first n type field stop layer 8a, the second n type field stop layer 8b, and the n type buffer layer 15 may be performed at the same time and may be performed separately.

In the implantation process for the field stop layer 8, to implant phosphorus atoms, for example, inorganic compounds of phosphorus and hydrogen, such as PH3 and PH2+ and represented by phosphine (PH3) based compounds, and gas that allow simultaneous implantation of phosphorus atoms and hydrogen atoms may be used, in addition to phosphorus ions. The second n type field stop layer 8b and the n type buffer layer 15 may be formed at the same time by performing a heat treatment to activate implanted impurities.

Hydrogen atoms may be introduced from the back surface by performing the annealing treatment in hydrogen atmosphere. Hydrogen atoms may be introduced from the back surface by performing plasma treatment using hydrogen-based gas as a material before the annealing treatment. It is desirable that phosphorus or arsenic ions are implanted after implantation of protons, since forming the first n type field stop layer 8a or the second n type field stop layer 8b by implanting protons after forming the n type buffer layer 15 by implanting phosphorus or arsenic ions leads to a concern that implantation profile of phosphorus or arsenic is changed by knocking phenomenon. If phosphine-based ions are implanted after implantation of protons, since free from the concern of knocking phenomenon, realization of arbitrary designed implantation profile of phosphine is easier.

Next, as shown in FIG. 15, the p type collector layer 9 is formed by implanting p type impurities from the second main surface side of the semiconductor substrate. The p type collector layer 9 may be formed by implanting boron (B). The p type collector layer 9 is also formed in the termination region 30, which becomes the p type termination collector layer. Next, the collector electrode 10 is formed on the second main surface of the semiconductor substrate. The collector electrode 10 is formed on the second main surface on entire region of the cell region 60 and the termination region 30. The collector electrode 10 may be formed by depositing an aluminum-silicon alloy (Al—Si based alloy) or titanium (Ti) or the like by a PVD process such as sputtering or evaporation. Alternatively, the collector electrode 10 may be formed by laminating a plurality of layers of metals such as an aluminum-silicon alloy, titanium, nickel, and gold. Further, a metal film may be formed on the metal film formed by the PVD process by electroless plating or electroplating to form the collector electrode 10.

The semiconductor device 50 is produced through the above-described steps. The semiconductor devices 50 are formed in the form of a matrix in a single wafer. Laser dicing or blade dicing is performed to cut the wafer into the individual semiconductor devices 50, whereby each of the semiconductor devices 50 is completed.

Here, for the description in detail of the field stop layer 8 of the semiconductor device 50 according to the first embodiment, a semiconductor device of a comparative example is described.

FIG. 16 is a diagram showing the semiconductor device of the comparative example. The semiconductor device of the comparative example is different from the semiconductor device 50 of the first embodiment in that the second field stop layer 8b is not provided between the first field stop layer 8a and the n type buffer layer 15. That is, in manufacturing the semiconductor device of the comparative example, only a single implantation process of protons is performed.

FIG. 17 shows profiles of the net carrier concentration and the hydrogen atom concentration, obtained by SR and SIMS respectively, along the dashed line D-D of the semiconductor device of the comparative example shown in FIG. 16. The net carrier concentration is a net free carrier concentration obtained by SR. The hydrogen atom concentration is a concentration of hydrogen atoms as impurities obtained by SIMS.

When the first n type field stop layer 8a is formed, in the range of proton (H+) implantation, a region with low crystallinity having various atomic configuration is formed because of collisions of the proton (H+) ions and silicon atoms in the semiconductor substrate. As shown in FIG. 17, there are different and many defects that may serve as donors or acceptors in the region with low crystallinity, and due to the compensation of carriers, a high resistivity region with a net carrier concentration lower than that of the semiconductor substrate is formed. Namely, in FIG. 17, the net carrier concentration of the semiconductor substrate is shown by dashed line, and a region of the solid line, showing the net carrier concentration, below the dashed line is a high resistivity region. Although the hydrogen atom concentration shown in in FIG. 17 is flat in the portion except for the peak being the first hydrogen atom concentration peak, the portion except for the peak shown as flat in the figure may have concentration below the detection limit of the analyzing device and the portion except for the peak can be non-flat, as long as the peak can be identified.

Regarding the high resistivity region, defects in the high resistivity region are recovered by an annealing treatment. However, there is a problem that recovery rate of the defects and thermal diffusion process of hydrogen atoms in the high resistivity region depend on concentrations of oxygen and carbon atoms in the semiconductor substrate. For example, hydrogen is less likely to be diffused when oxygen is in the semiconductor substrate as the hydrogen is easily combined with oxygen, and when there are many oxygen atoms the diffusion of hydrogen is hindered and hydrogen is difficult to be distributed to defects that need to be recovered, and recovery of the defects become difficult. Above-described problem is more pronounced in the case of hydrogen than in the case of carbon. Accordingly, in a semiconductor substrate with high oxygen concentration, the high resistivity region in the range of hydrogen implantation is difficult to recover. For example, the high resistivity region is difficult to recover in an MCZ wafer containing higher concentration oxygen than a FZ wafer. With a high resistivity region, leak current between the emitter and collector of the semiconductor device is increased, and energy loss during off state deteriorates.

Field stop layers containing hydrogen donors are often optimized depending on application of semiconductor devices. For example, it is not desirable to change conditions for hydrogen implantation for the purpose of recovery of the high resistivity region as described in International Publication No. WO 2013/089256. This is because oxygen atoms or hydrogen atoms content varies depending on semiconductor substrates. If dose amount of hydrogen atoms is changed depending on oxygen atoms or hydrogen atoms content of semiconductor substrates, configuration of the field stop layers varies depending on wafers, and switching characteristics and surge voltage are varied. In other words, change in the net carrier concentration profile of the field stop layers make it difficult to design devices with an objective of controlling surge voltage or suppressing oscillation. For this reason, it is required to form the field stop layers under the same process condition for semiconductor substrates of any oxygen concentration and carbon concentration.

In the first embodiment, the low dose hydrogen implantation is performed with an objective of forming the field stop layers with homogeneous properties under the same process for semiconductor substrates of any oxygen concentration and carbon concentration. As shown in FIG. 18, with the low dose implantation of hydrogen atoms which does not change the profile of the net carrier concentration, the same field stop layers can be formed in semiconductor substrates of any oxygen concentration and carbon concentration without changing structures and functions of the field stop layers.

As described above, by using the above described method of hydrogen implantation, the semiconductor device can be easily manufactured in which the profile of the net carrier concentration does not form high resistivity region and does not have local minimum in the region where the profile become substantially flat from the second main surface side toward the first main surface side. Further, compared to the semiconductor device of the comparative example, processing time of heat treatment to remove the high resistivity region can be reduced. Because of these reasons, productivity of the semiconductor device is increased.

In the semiconductor device according to the first embodiment, since the field stop layer, in which the hydrogen atom concentration profile has more peaks than the free carrier concentration profile at room temperature being the net carrier concentration, is provided, high resistivity region of the net carrier concentration is removed, and deterioration of energy loss is suppressed. In addition, in the method of manufacturing the semiconductor device according to the first embodiment, the field stop layers can be formed under the same process condition for semiconductor substrates of any oxygen concentration, and wafer dependent variation of electrical properties of the semiconductor devices such as switching characteristics and surge voltage due to the variation of the configuration of the field stop layers is suppressed.

Second Embodiment

In the present embodiment, the semiconductor device according to the above-mentioned first embodiment is applied to a power conversion device. The present disclosure is not limited to a specific power conversion device, and the following describes the case where the present disclosure is applied to a three-phase inverter as a second embodiment.

FIG. 20 is a block diagram showing a configuration of a power conversion system to which a power conversion device according to the second embodiment is applied.

The power conversion system shown in FIG. 20 includes a power supply 100, a power conversion device 200, and a load 300. The power supply 100 is a direct current (DC) power supply and supplies DC power to the power conversion device 200. The power supply 100 can be configured of various types of devices, and may be configured of a DC system, a solar cell, or a storage battery, for example, or may be configured of a rectifier circuit connected to an alternating current (AC) system or configured of an AC/DC converter. Also, the power supply 100 may be configured of a DC/DC converter that converts DC power output from the DC system into predetermined power.

The power conversion device 200, which is a three-phase inverter connected between the power supply 100 and the load 300, converts the DC power supplied from the power supply 100 into AC power, and supplies the converted AC power to the load 300. The power conversion device 200 includes: a main conversion circuit 201 that converts DC power into AC power and outputs the converted AC power; a drive circuit 202 that outputs a drive signal for driving each switching element of the main conversion circuit 201; and a control circuit 203 that outputs a control signal for controlling the drive circuit 202 to the drive circuit 202.

The load 300 is a three-phase electric motor driven by AC power supplied from the power conversion device 200. The load 300 is not limited to a specific application, but is an electric motor mounted on each of various electric devices and used as an electric motor, for example, for a hybrid vehicle, an electric vehicle, a railroad vehicle, an elevator, or an air conditioner.

In the following, the power conversion device 200 is described in detail. The main conversion circuit 201 includes a switching element (not shown in the figures). By switching of the switching element, the DC power supplied from the power supply 100 is converted into AC power and supplied to the load 300. While the specific circuit configuration of the main conversion circuit 201 may be of various types, the main conversion circuit 201 according to the present embodiment is a three-phase full bridge circuit configured in two levels, and may be configured of six switching elements. The semiconductor device according to the above-described first embodiment is applied to each switching element of the main conversion circuit 201. Six switching elements are configured such that each two switching elements are connected in series to form an upper arm and a lower arm. Each of the pairs of upper and lower arms forms a corresponding phase (a U-phase, a V-phase, and a W-phase) of a full bridge circuit. The output terminals of the upper and lower arms, that is, three output terminals of the main conversion circuit 201, are connected to the load 300.

The drive circuit 202 generates drive signals for driving the switching elements of the main conversion circuit 201, and supplies the drive signals to the control electrodes of the switching elements of the main conversion circuit 201. Specifically, in accordance with a control signal from the control circuit 203 described below, a drive signal to turn on the switching element and a drive signal to turn off the switching element are output to the control electrodes of the respective switching elements. When the switching element is maintained in the ON state, the drive signal is a voltage signal equal to or higher than the threshold voltage of the switching element (ON signal), and when the switching element is maintained in the OFF state, the drive signal is a voltage signal equal to or lower than the threshold voltage of the switching element (OFF signal).

The control circuit 203 controls each switching element in the main conversion circuit 201 so as to supply desired electric power to the load 300. Specifically, the time (ON time) at which each switching element in the main conversion circuit 201 is to be in an ON state is calculated based on the electric power to be supplied to the load 300. For example, the control circuit 203 can control the main conversion circuit 201 by pulse width modulation (PWM) control for modulating the ON time of each switching element according to the voltage to be output. Then, the control circuit 203 outputs a control command (control signal) to the drive circuit 202 such that an ON signal is output to the switching element that is to be in an ON state at each point of time and such that an OFF signal is output to the switching element that is to be in an OFF state at each point of time. According to this control signal, the drive circuit 202 outputs an ON signal or an OFF signal as a drive signal to the control electrode of each switching element.

In the power conversion device according to the present embodiment, since the semiconductor device according to the first embodiment is applied as a switching element of the main conversion circuit 201, the high resistivity region of the net carrier concentration is removed, and deterioration of energy loss is suppressed.

The present embodiment has been described with reference to the example in which the present disclosure is applied to a three-phase inverter configured in two levels, but the present disclosure is not limited thereto and is applicable to various types of power conversion devices. In the present embodiment, the power conversion device is configured in two levels, but the power conversion device may be configured in three levels or in a multilevel. When electric power is supplied to a single-phase load, the present disclosure may be applied to a single-phase inverter. Also, when electric power is supplied to a DC load or the like, the present disclosure may also be applicable to a DC/DC converter or an AC/DC converter.

Further, the power conversion device to which the present disclosure is applied is not limited to the case where the above-mentioned load is an electric motor, but may also be used as a power supply device for an electrical discharge machine, a laser beam machine, an induction heating cooking machine, or a contactless power feeding system, or may also be used as a power conditioner for a solar power generation system, a power storage system or the like.

Although the semiconductor device is an IGBT in the above-described example, the semiconductor device may be a metal-oxide-semiconductor field-effect transistor (MOS-FET), a diode, or a reverse conducting IGBT (RC-IGBT). Also, although the semiconductor device formed of silicon is described, the semiconductor device may be formed of a wide bandgap semiconductor, whose bandgap is larger than that of silicon. The wide bandgap semiconductor is, for example, silicon carbide, gallium nitride, gallium oxide based material, or diamond.

The concentration peak in the present disclosure indicates a point where the derivative of the concentration with respect the depth changes from negative to positive in the concentration profile taken from the second main surface toward the first main surface of the semiconductor device. In obtaining the derivative, it is not necessary to use raw measured data and smoothed data can be used by, for example, moving average of neighboring measurement points. In the present disclosure, the net carrier concentration indicates free carrier concentration at room temperature, and specifically the room temperature is $25°$ C.$±10°$ C. The net carrier concentration is calculated from SR and capacitance measurement in general. Whether or not there is a local minimum need not be determined based on all measurement points, and may be determined based on smoothed data by, for example, moving average of neighboring measurement points. If the net carrier concentration of the field stop layer have a local minimum, there are problems that leak current between emitter and collector increases and turn-off loss increases. The local minimum of the net carrier concentration referred to as a problem here is the local minimum in the region where the high resistivity region formed by hydrogen implantation process is not sufficiently activated. Local minimum of the net carrier concentration that incidentally appears around the border between the n type buffer layer 15 and the collector layer 9 when the field stop layer 8 is formed is not a problem even if it exists.

Although several embodiments have been presented as above, these embodiments are presented as examples. These embodiments may be implemented with various omissions, replacements, or modifications within the scope of the gist. Further, embodiments may be combined.

Hereinafter, various aspects of the present disclosure will be collectively described as appendixes.

APPENDIX 1

A semiconductor device comprising:

a drift layer of a first conductivity type provided between a first main surface and a second main surface of a semiconductor substrate having the first main surface and the second main surface opposite to the first main surface; and a field stop layer of the first conductivity type having an impurity concentration higher than that of the drift layer and provided between the drift layer and the second main surface, wherein a net carrier concentration profile at room temperature of the field stop layer have at least one peak from the second main surface toward the first main surface, wherein a hydrogen atom concentration profile of the field stop layer have at least two peaks from the second main surface toward the first main surface, and wherein the hydrogen atom concentration profile has more peaks than the net carrier concentration profile.

APPENDIX 2

The semiconductor device according to Appendix 1, wherein the field stop layer have:

a first field stop layer whose hydrogen atom concentration profile have a first hydrogen atom concentration peak; and a second field stop layer having a second hydrogen atom concentration peak smaller than the first hydrogen atom concentration peak.

APPENDIX 3

The semiconductor device according to Appendix 2, wherein the second field stop layer is provided closer to the second main surface than the first field stop layer is, and wherein the net carrier concentration profile does not have a peak in the same position as the second hydrogen atom concentration peak.

APPENDIX 4

The semiconductor device according to Appendix 2 or 3, wherein a half width of the second hydrogen atom concentration peak is larger than a half width of the first hydrogen atom concentration peak.

APPENDIX 5

The semiconductor device according to any one of Appendixes 2 to 4, wherein the second hydrogen atom concentration peak can be approximated by a non-gaussian distribution.

APPENDIX 6

The semiconductor device according to any one of Appendixes 2 to 5, wherein the second hydrogen atom concentration peak is equal to or less than $\frac{1}{100}$ times the first hydrogen atom concentration peak.

APPENDIX 7

The semiconductor device according to any one of Appendixes 1 to 6, further comprising a buffer layer of the first conductivity type containing phosphorus or arsenic impurities and provided between the field stop layer and the second main surface.

APPENDIX 8

The semiconductor device according to any one of Appendixes 1 to 7, wherein an oxygen atom content of the semiconductor substrate is equal to or more than $1 \times 10^{17}$ cm$^{-3}$.

APPENDIX 9

The semiconductor device according to any one of Appendixes 1 to 8, wherein the semiconductor substrate is an MCZ wafer.

APPENDIX 10

A method of manufacturing a semiconductor device, comprising:

preparing a semiconductor substrate having a drift layer of a first conductivity type between a first main surface and a second main surface opposite to the first main surface;

implanting first conductivity type impurities into the semiconductor substrate in a depth direction from the second main surface toward the first main surface; and performing a heat treatment in which the first conductivity type impurities are diffused and in which a field stop layer having an impurity concentration higher than that of the drift layer and provided between the drift layer and the second main surface is formed, wherein a net carrier concentration profile at room temperature of the field stop layer formed in the heat treatment have at least one peak from the second main surface toward the first main surface, wherein a hydrogen atom concentration profile of the field stop layer formed in the heat treatment have at least two peaks from the second main surface toward the first main surface, and wherein the hydrogen atom concentration profile has more peaks than the net carrier concentration profile.

APPENDIX 11

The method of manufacturing the semiconductor device according to Appendix 10, wherein the implanting includes a first implanting in which first impurities being first conductivity type impurities are implanted and a second implanting in which second impurities being first conductivity type impurities are implanted, wherein in the first implanting, acceleration energy is equal to or more than 800 keV and less than 2000 keV and implantation amount of the first impurities is equal to or more than $1 \times 10^{13}$ cm$^{-2}$ and equal to or less than $1 \times 10^{15}$ cm$^{-2}$, and wherein in the second implanting, acceleration energy is equal to or more than 200 keV and equal to or less than 800 keV and implantation amount of the second impurities is equal to or more than $1 \times 10^{11}$ cm$^{-2}$ and less than $5 \times 10^{12}$ cm$^{-2}$.

APPENDIX 12

The method of manufacturing the semiconductor device according to Appendix 11, wherein the first implanting is performed after the second implanting.

APPENDIX 13

The method of manufacturing the semiconductor device according to Appendix 11 or 12, wherein the first impurities are protons.

APPENDIX 14

The method of manufacturing the semiconductor device according to any one of Appendixes 11 to 13,
    wherein the second impurities are compounds of phosphorus and hydrogen.

APPENDIX 15

The method of manufacturing the semiconductor device according to any one of Appendixes 10 to 14,
    wherein heat treatment temperature in the heat treatment is equal to or more than 350° C. and equal to or less than 500° C.

APPENDIX 16

A power conversion device, comprising:
    a main conversion circuit that has the semiconductor device according to any one of Appendixes 1 to 9, and which converts input electric power and outputs the converted electric power;
    a drive circuit that outputs, to the semiconductor device, a drive signal for driving the semiconductor device; and
    a control circuit that outputs, to the drive circuit, a control signal for controlling the drive circuit.

While the disclosure has been shown and described in detail, the foregoing description is in all aspects illustrative and not restrictive. It is therefore understood that numerous modifications and variations can be devised.

What is claimed is:

1. A semiconductor device comprising:
    a drift layer of a first conductivity type provided between a first main surface and a second main surface of a semiconductor substrate having the first main surface and the second main surface opposite to the first main surface; and
    a field stop layer of the first conductivity type having an impurity concentration higher than that of the drift layer and provided between the drift layer and the second main surface,
    wherein a net carrier concentration profile at room temperature of the field stop layer have at least one peak from the second main surface toward the first main surface,
    wherein a hydrogen atom concentration profile of the field stop layer have at least two peaks from the second main surface toward the first main surface, and
    wherein the hydrogen atom concentration profile has more peaks than the net carrier concentration profile.

2. The semiconductor device according to claim 1,
    wherein the field stop layer have:
    a first field stop layer whose hydrogen atom concentration profile have a first hydrogen atom concentration peak; and
    a second field stop layer having a second hydrogen atom concentration peak smaller than the first hydrogen atom concentration peak.

3. The semiconductor device according to claim 2,
    wherein the second field stop layer is provided closer to the second main surface than the first field stop layer is, and
    wherein the net carrier concentration profile does not have a peak in the same position as the second hydrogen atom concentration peak.

4. The semiconductor device according to claim 2,
    wherein a half width of the second hydrogen atom concentration peak is larger than a half width of the first hydrogen atom concentration peak.

5. The semiconductor device according to claim 2,
    wherein the second hydrogen atom concentration peak can be approximated by a non-gaussian distribution.

6. The semiconductor device according to claim 2,
    wherein the second hydrogen atom concentration peak is equal to or less than $\frac{1}{100}$ times the first hydrogen atom concentration peak.

7. The semiconductor device according to claim 1,
    further comprising a buffer layer of the first conductivity type containing phosphorus or arsenic impurities and provided between the field stop layer and the second main surface.

8. The semiconductor device according to claim 1,
    wherein an oxygen atom content of the semiconductor substrate is equal to or more than $1 \times 10^{17}$ $cm^{-3}$.

9. The semiconductor device according to claim 1,
    wherein the semiconductor substrate is an MCZ wafer.

10. A power conversion device, comprising:
    a main conversion circuit that has the semiconductor device according to claim 1, and which converts input electric power and outputs the converted electric power;
    a drive circuit that outputs, to the semiconductor device, a drive signal for driving the semiconductor device; and
    a control circuit that outputs, to the drive circuit, a control signal for controlling the drive circuit.

11. A method of manufacturing a semiconductor device, comprising:
    preparing a semiconductor substrate having a drift layer of a first conductivity type between a first main surface and a second main surface opposite to the first main surface;
    implanting first conductivity type impurities into the semiconductor substrate in a depth direction from the second main surface toward the first main surface; and
    performing a heat treatment in which the first conductivity type impurities are diffused and in which a field stop layer having an impurity concentration higher than that of the drift layer and provided between the drift layer and the second main surface is formed,
    wherein a net carrier concentration profile at room temperature of the field stop layer formed in the heat treatment have at least one peak from the second main surface toward the first main surface,
    wherein a hydrogen atom concentration profile of the field stop layer formed in the heat treatment have at least two peaks from the second main surface toward the first main surface, and
    wherein the hydrogen atom concentration profile has more peaks than the net carrier concentration profile.

12. The method of manufacturing the semiconductor device according to claim 11,
    wherein the implanting includes a first implanting in which first impurities being first conductivity type impurities are implanted and a second implanting in which second impurities being first conductivity type impurities are implanted,
    wherein in the first implanting, acceleration energy is equal to or more than 800 keV and less than 2000 keV and implantation amount of the first impurities is equal to or more than $1 \times 10^{13}$ $cm^{-2}$ and equal to or less than $1 \times 10^{15}$ $cm^{-2}$, and wherein in the second implanting, acceleration energy is equal to or more than 200 keV and equal to or less than 800 keV and implantation amount of the second impurities is equal to or more than $1 \times 10^{11}$ cm$^{-2}$ and less than $5 \times 10^{12}$ cm$^{-2}$.

13. The method of manufacturing the semiconductor device according to claim 12, wherein the first implanting is performed after the second implanting.

14. The method of manufacturing the semiconductor device according to claim 12, wherein the first impurities are protons.

15. The method of manufacturing the semiconductor device according to claim 12, wherein the second impurities are compounds of phosphorus and hydrogen.

16. The method of manufacturing the semiconductor device according to claim 11, wherein heat treatment temperature in the heat treatment is equal to or more than 350° C. and equal to or less than 500° C.

\* \* \* \* \*